(12) United States Patent
Fukai

(10) Patent No.: US 11,901,882 B2
(45) Date of Patent: Feb. 13, 2024

(54) GATE DRIVE CIRCUIT

(71) Applicant: Sansha Electric Manufacturing Co., Ltd., Osaka (JP)

(72) Inventor: Masashi Fukai, Osaka (JP)

(73) Assignee: SANSHA ELECTRIC MANUFACTURING CO., LTD., Osaka (JP)

( * ) Notice: Subject to any disclaimer, the term of this patent is extended or adjusted under 35 U.S.C. 154(b) by 0 days.

(21) Appl. No.: 17/060,150

(22) Filed: Oct. 1, 2020

(65) Prior Publication Data
US 2021/0126630 A1 Apr. 29, 2021

(30) Foreign Application Priority Data
Oct. 28, 2019 (JP) .................. 2019-195130

(51) Int. Cl.
*H03K 17/0812* (2006.01)
*H03K 17/08* (2006.01)

(52) U.S. Cl.
CPC .............. *H03K 17/08122* (2013.01); *H03K 2017/0806* (2013.01)

(58) Field of Classification Search
CPC .............. H03K 17/08122; H03K 2017/0806
See application file for complete search history.

(56) References Cited

U.S. PATENT DOCUMENTS

| 4,220,877 A | 9/1980 | Giordano |
| 7,800,430 B2 * | 9/2010 | Ferro .................. G05F 3/225 |
| | | 327/513 |
| 8,963,621 B2 * | 2/2015 | Gerna .................. H03K 3/012 |
| | | 327/512 |
| 2010/0148846 A1 | 6/2010 | Hiyama |
| 2019/0326887 A1 | 10/2019 | Kaya et al. |

FOREIGN PATENT DOCUMENTS

| EP | 3239675 A1 | 11/2017 |
| JP | H05-048584 U | 6/1993 |
| WO | 2019130533 A1 | 4/2019 |

OTHER PUBLICATIONS

Extended European Search Report for corresponding EP Application No. 20196725.4 dated Feb. 26, 2021.

* cited by examiner

*Primary Examiner* — Ryan Johnson
*Assistant Examiner* — Colleen J O Toole
(74) *Attorney, Agent, or Firm* — Renner, Otto, Boisselle & Sklar, LLP

(57) ABSTRACT

In a gate drive circuit of which an N-channel MOSFET and a P-channel MOSFET are connected in a push-pull manner to amplify an input pulse signal and drive an output element, a temperature correction circuit is connected between gate terminals of the N-channel MOSFET and the P-channel MOSFET. The temperature correction circuit lowers each of gate voltages of the N-channel MOSFET and the P-channel MOSFET as ambient temperature rises.

4 Claims, 9 Drawing Sheets

GATE DRIVE CIRCUIT

BACKGROUND OF THE INVENTION

1. Field of the Invention

The present invention relates to a gate drive circuit in which an N-channel MOSFET and a P-channel MOSFET are connected in a push-pull manner to drive a power semiconductor element.

2. Description of the Related Art

There are some kinds of gate drive circuits for driving power semiconductor elements such as a power MOSFET and an IGBT. For instance, there is disclosed a gate drive circuit in which an N-channel MOSFET and a P-channel MOSFET are connected in a push-pull manner (Unexamined Utility Model Application Publication No. H05-048584). The gate drive circuit makes it possible to achieve a low-loss and high-speed switching drive.

In the gate drive circuit as shown in the above-mentioned prior Patent Literature, however, a gate voltage is fixed without being subjected to temperature correction. This causes the following problems, which are caused by changes in temperature, as mentioned below.
1) Turn-on delay time and turn-off delay time are different between low temperature and high temperature. Thus, temperature dependence occurs in a response of a gate drive circuit.
2) Simultaneous ON time of an N-channel MOSFET and a P-channel MOSFET becomes long, thereby increasing their losses. Especially, when high frequency switching is performed, if the temperature of elements rises, the elements will easily be turned on simultaneously, thereby increasing their losses.

These problems are caused because a threshold of MOSFET changes with temperature (ambient temperature).

The invention notes that a threshold of MOSFET changes with temperature (ambient temperature). An object of the invention is to provide a gate drive circuit that changes gate voltage depending on temperature (ambient temperature).

SUMMARY OF THE INVENTION

A gate drive circuit of the invention includes: an N-channel MOSFET and a P-channel MOSFET connected in a push-pull manner; and a temperature correction circuit connected between the above-mentioned N-channel MOSFET and the above-mentioned P-channel MOSFET.

The above-mentioned temperature correction circuit lowers gate voltage of the above-mentioned P-channel MOSFET as ambient temperature rises.

The above-mentioned temperature correction circuit includes a transistor and a thermistor circuit. Between a collector and an emitter of the above-mentioned transistor, each of gate terminals of the above-mentioned N-channel MOSFET and the above-mentioned P-channel MOSFET is connected. The thermistor circuit includes a thermistor element connected between a base and the emitter of the above-mentioned transistor.

According to the above-mentioned configuration, the temperature correction circuit lowers (drops) gate voltage of the P-channel MOSFET, as temperature (ambient temperature) rises. This makes it possible to reduce a delay difference in each of turn-on delay time and turn-off delay time. Herein, the turn-on delay time and the turn-off delay time change with temperature. Further, simultaneous ON time of the N-channel MOSFET and the P-channel MOSFET does not become long, so that an increase in losses can be prevented.

Especially, the losses, which easily occur at high temperatures when high frequency switching is performed, can be reduced.

DETAILED DESCRIPTION OF THE INVENTION

Figure 1:
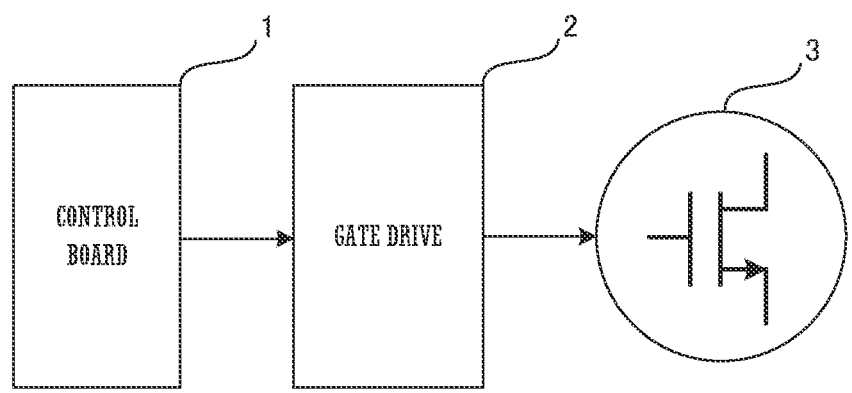
FIG. 1 is a schematic diagram of a power module circuit in accordance with an exemplary embodiment of the invention.

FIG. 1 is a schematic diagram of a power module circuit in accordance with an exemplary embodiment of the invention.

In FIG. 1, a control board 1 outputs a pulse signal to a gate drive circuit 2. The gate drive circuit 2 amplifies the pulse signal, and supplies it to a power MOSFET element 3. The gate drive circuit 2 is a portion in accordance with the invention.

Figure 2:
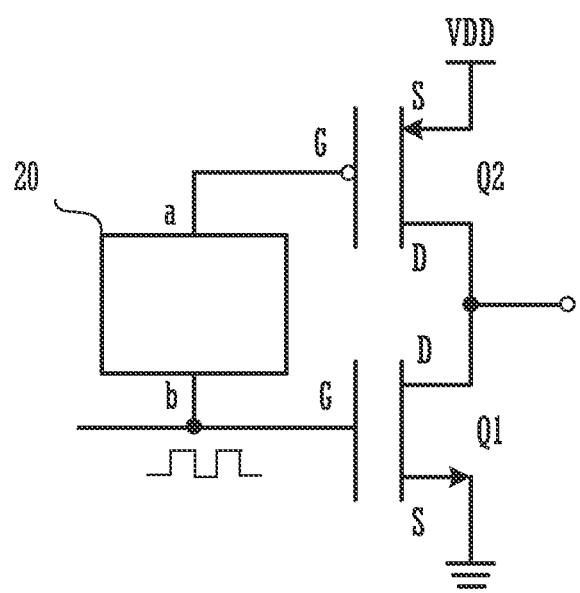
FIG. 2 is a configuration diagram of a gate drive circuit 2.

FIG. 2 is a configuration diagram of the gate drive circuit 2.

An N-channel MOSFET (nMOSFET) Q1 and a P-channel MOSFET (pMOSFET) Q2 are connected in series (push-pull) to constitute the gate drive circuit 2. Further, a temperature correction circuit 20 is connected between gate terminals (gate G) of the nMOSFET Q1 and the pMOSFET Q2. The input pulse signal from the control board 1 is inputted to the gate G of the nMOSFET Q1, and inputted to the gate G of the pMOSFET Q2 through the temperature correction circuit 20. The temperature correction circuit 20 is a circuit that drops an output voltage as ambient temperature rises. In other words, the temperature correction circuit 20 lowers the gate voltage at the time when the pMOSFET Q2 is turned on, as ambient temperature rises.

Figure 3:
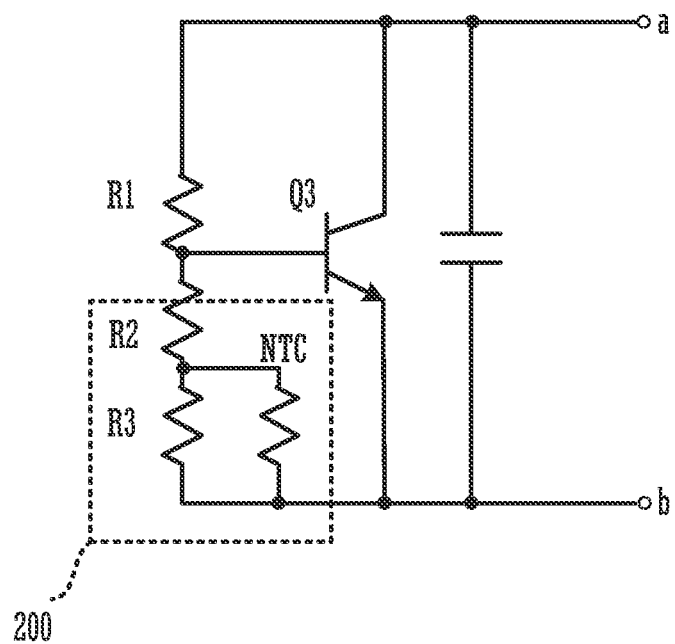
FIG. 3 is a circuit diagram of a temperature correction circuit 20.

FIG. 3 is a circuit diagram of the temperature correction circuit 20.

In the temperature correction circuit 20, a thermistor circuit 200 is connected between a base and an emitter of a transistor Q3. The thermistor circuit 200 is constituted by a resistor R2 (a first resistor), a resistor R3 (a second resistor), and a thermistor NTC. Herein, the resistor R2 and the resistor R3 are connected in series to each other, and the thermistor NTC is connected in parallel to the resistor R3. The resistor R2 and the resistor R3 are provided to adjust temperature-voltage characteristics (negative characteristics) of the thermistor NTC. A collector and the emitter of the transistor Q3 are connected between gates G of Q1 and Q2 through output terminals "a" and "b." This drops the gate voltage V(GS) of the pMOSFET Q2. The drop voltage changes with ambient temperature.

Figure 4:
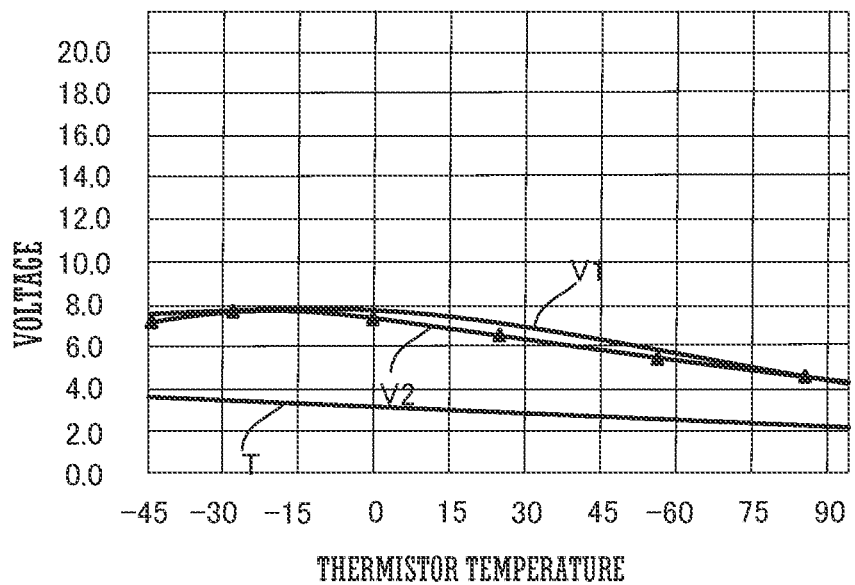
FIG. 4 shows a relationship between ambient temperature (thermistor temperature) and a gate voltage V(GS), when the temperature correction circuit 20 is provided.
Figure 5:
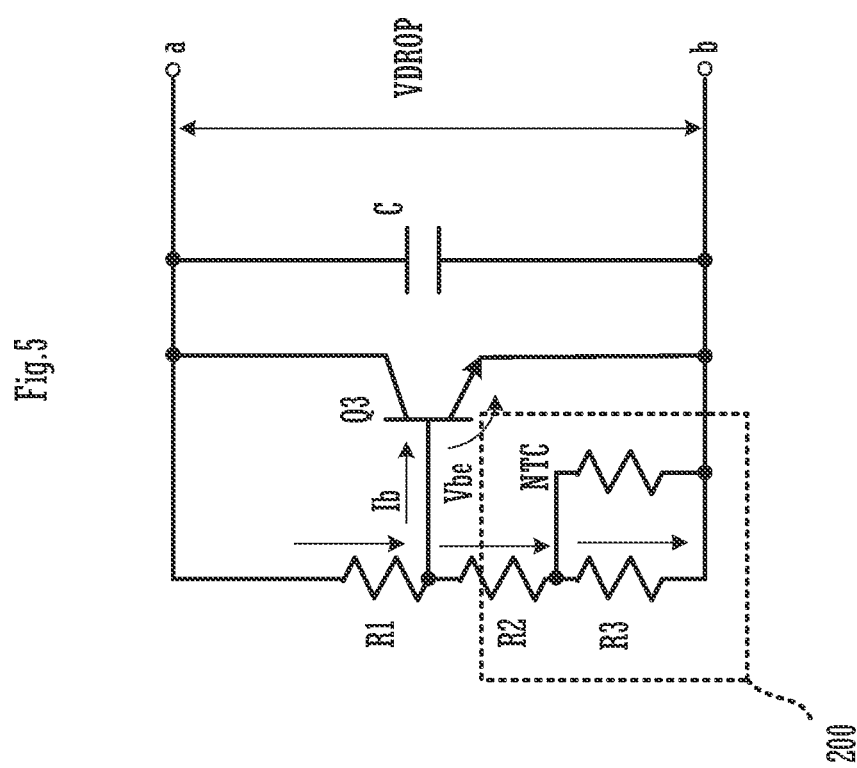
FIG. 5 shows a calculation method of obtaining a calculation value V1.

FIG. 4 shows a relationship between ambient temperature (thermistor temperature) and the gate voltage V(GS), when the temperature correction circuit 20 is provided. According to characteristics of an FET, gate voltage thresholds T of the nMOSFET Q1 and the pMOSFET Q2 are decreased as ambient temperature (thermistor temperature) becomes high. On the other hand, the gate voltage V(GS) is preferably designed to have a value around approximately twice the above-mentioned threshold T, i.e., a value substantially twice the above-mentioned threshold T. The resistors R2, R3, and characteristics of thermistor NTC shown in FIG. 3 are chosen such that the gate voltage V(GS) has as large as the above-mentioned value. The calculation value V1 of the gate voltage V(GS) in FIG. 3 and FIG. 5 is obtained as follows.

$$V(GS)=(Vcc-Vee)-VDROP \ VDROP=VR1+Vbe$$
$$VR1=R1\times(IR2+Ib) \ IR2=Vbe/[R2+\{(R3\times RTHERMISTOR)/R3+RTHERMISTOR)\}]$$
$$RTHERMISTOR(T1)=RTHERMISTOR(T2)$$
$$expB\{(1/T1)-(1/T2)\}$$

where
- V(GS): gate voltages of nMOSFET Q1 and pMOSFET Q2
- Vcc: gate voltage (positive):
- Vee: gate voltage (negative)
- VDROP: drop voltage:
- RTHERMISTOR(T1): resistance [Q] at absolute temperature T1 [K]
- RTHERMISTOR(T2): resistance [Q] at absolute temperature T2[K].

In the above description, according to temperature characteristics of the thermistor NTC, I(R2) is increased as temperature becomes high. Accordingly, a drop voltage V(DROP) is increased as the temperature becomes high, so that the gate voltage V(GS) is decreased. As a result of the above-mentioned calculation, the calculation value V1 of the gate voltage V(GS) is decreased as the temperature becomes high, as shown in FIG. 4. Note that, FIG. 4, which also shows a measured value V2 of the gate voltage, indicates that the calculation value V1 and the measured value V2 are mostly matched.

As mentioned above, the temperature correction circuit 20 of FIG. 3 is connected in the manner shown in FIG. 2, thereby making it possible to decrease the gate voltage V(GS) as ambient temperature (thermistor temperature) rises, as shown in FIG. 4.

Next, an operation of the temperature correction circuit 20 will be described with reference to FIGS. 6 through 9.

Figure 6:
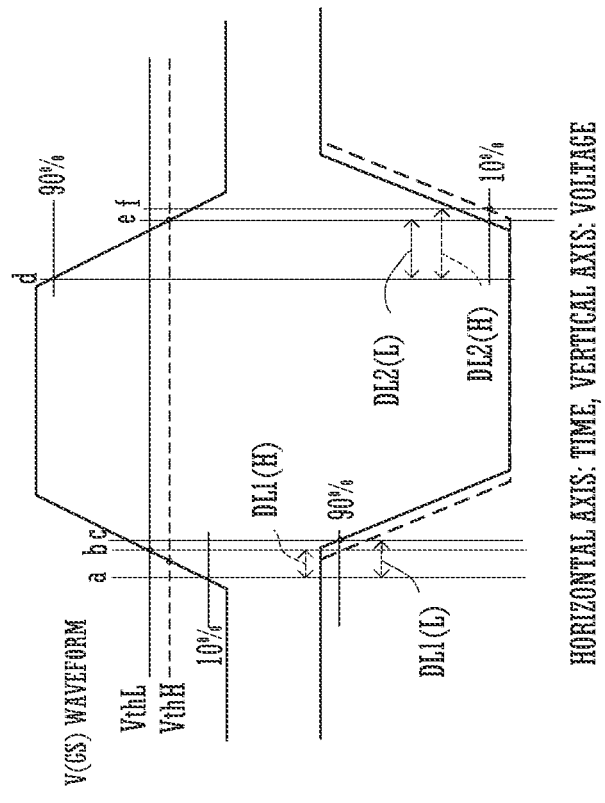
FIG. 6 shows a configuration of the gate drive circuit 2 when the temperature correction circuit 20 is not provided, and shows turn-on delay time and turn-off delay time of an nMOSFET Q1.
Figure 6:
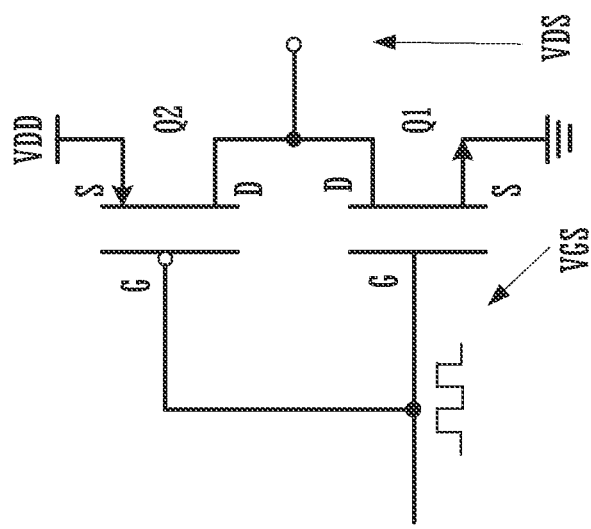
Figure 7:
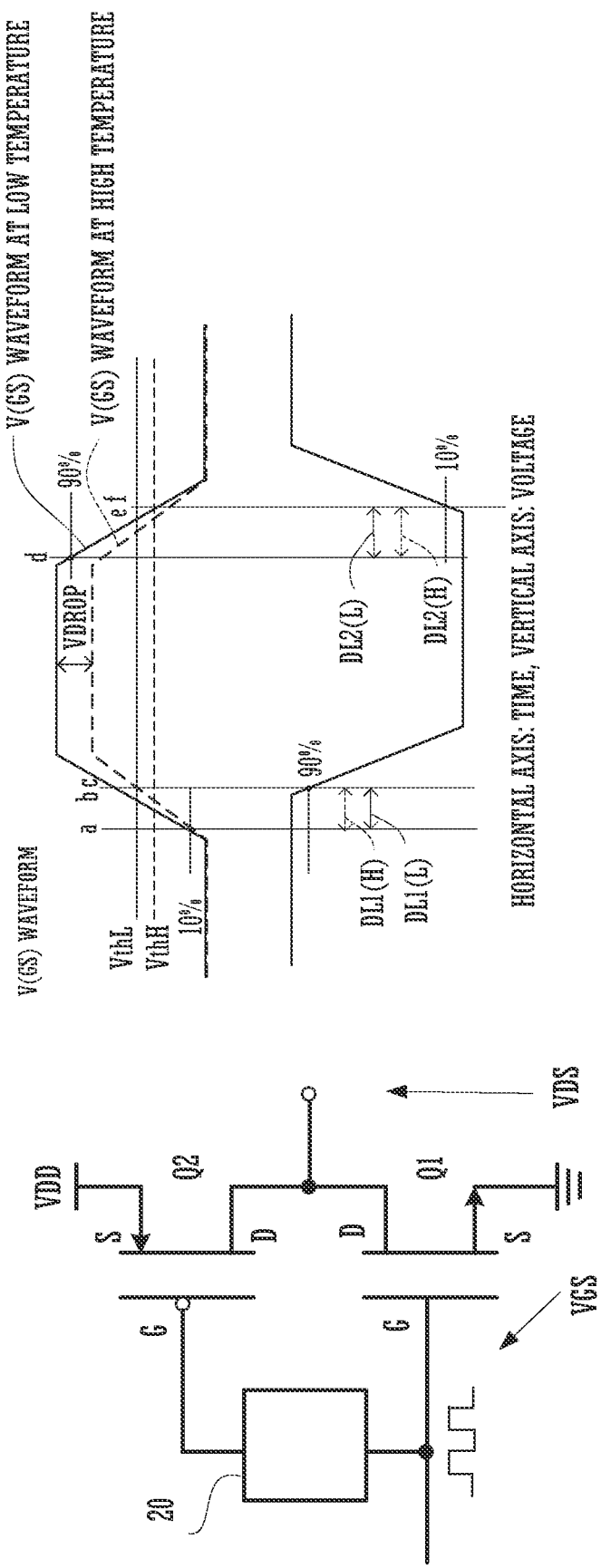
FIG. 7 shows a configuration of the gate drive circuit 2 when the temperature correction circuit 20 is provided, and shows turn-on delay time and turn-off delay time of the nMOSFET Q1.

FIG. 6 shows a configuration of the gate drive circuit 2 when the temperature correction circuit 20 is not provided, and shows turn-on delay time and turn-off delay time of the nMOSFET Q1. FIG. 7 shows a configuration of the gate drive circuit 2 when the temperature correction circuit 20 is provided, and shows turn-on delay time and turn-off delay time of the nMOSFET Q1.

In FIGS. 6 and 7, each of signs has the following meaning.
- a 10% of gate voltage (input gate waveform) V(GS)
- b 90% of drain-source voltage of a target MOS (at high temperature)
- c 90% of drain-source voltage of the target MOS (at low temperature)
- d 90% of the input gate waveform V(GS)
- e 10% of drain-source voltage of the target MOS (at high temperature)
- f 10% of drain-source voltage of the target MOS (at low temperature)
- DL1(H) turn-on delay time (at high temperature)
- DL1(L) turn-on delay time (at low temperature)
- DL2(H) turn-off delay time (at high temperature)
- DL2(L) turn-off delay time (at low temperature)

A pulse waveform (input pulse) shown on an upper side in FIG. 6 is the gate voltage V(GS), and a pulse waveform shown on a lower side in FIG. 6 is a drain-source voltage V(DS). In FIG. 6, according to characteristics of the nMOSFET Q1, a threshold (voltage) (V(thL)) at the time when the nMOSFET Q1 is turned on at low temperature differs from a threshold (voltage) (V(thH)) at the time when the nMOSFET Q1 is turned on at high temperature (V(thL)>V(thH)).

Accordingly, like the pulse waveform (V(DS) waveform) shown on the lower side in FIG. 6, turn-on delay time of the drain-source voltage V(DS) is changed between low temperature and high temperature. In other words, the turn-on delay time DL1(L) at low temperature is larger than (>) the turn-on delay time DL1(H) at high temperature. Similarly, the turn-off delay time DL2(L) at low temperature is smaller than (<) the turn-off delay time DL2(H) at high temperature. Note that, the turn-on delay time and the turn-off delay time are defined as a period from 10% of the gate voltage V(GS) to 90% of the drain-source voltage V(DS) in the pulse rising section and a period from 90% of the gate voltage V(GS) to 10% of the drain-source voltage V(DS) in the pulse falling section, respectively.

Further, although the nMOSFET Q1 is described in FIG. 6, the pMOSFET Q2 is also the same as in the nMOSFET Q1. The pMOSFET Q2 is on during a period of time when the nMOSFET Q1 is off, and causes a difference in turn-on delay time and turn-off delay time due to its temperature dependence, like the nMOSFET Q1.

Similarly to FIG. 6, a pulse waveform (input pulse) shown on an upper side in FIG. 7 is the gate voltage V(GS), and a pulse waveform shown on a lower side in FIG. 7 is the drain-source voltage V(DS). The pulse waveform (input pulse) shown on the upper side in FIG. 7 shows that the gate voltage V(GS) at low temperature differs from the gate voltage V(GS) at high temperature. This is caused by the drop voltage V(DROP) of the temperature correction circuit 20. In other words, the following relation is satisfied, i.e., "gate voltage V(GS) at low temperature+drop voltage V(DROP)=gate voltage V(GS) at high temperature." As a result, like the waveform of the drain-source voltage V(DS) shown on the lower side in FIG. 7, the following relation is satisfied, i.e., "turn-on delay time DL1(L) at low temperature=turn-on delay time DL1(H) at high temperature." Further, the following relation is also satisfied, i.e., "turn-off delay time DL2(L) at low temperature=turn-off delay time DL2(H) at high temperature."

Further, although the nMOSFET Q1 is described in FIG. 7, the pMOSFET Q2 is also the same as in the the nMOSFET Q1. The pMOSFET Q2 is on during a period of time when the nMOSFETQ1 is off, and has turn-on delay time and turn-off delay time. Even if temperature is changed, the turn-on delay time and the turn-off delay time are the same.

In this way, the presence of the temperature correction circuit 20 makes it possible to cancel temperature dependence of a threshold of MOSFET, so that turn-on delay time and turn-off time delay can be made the same regardless of temperature.

Figure 8:
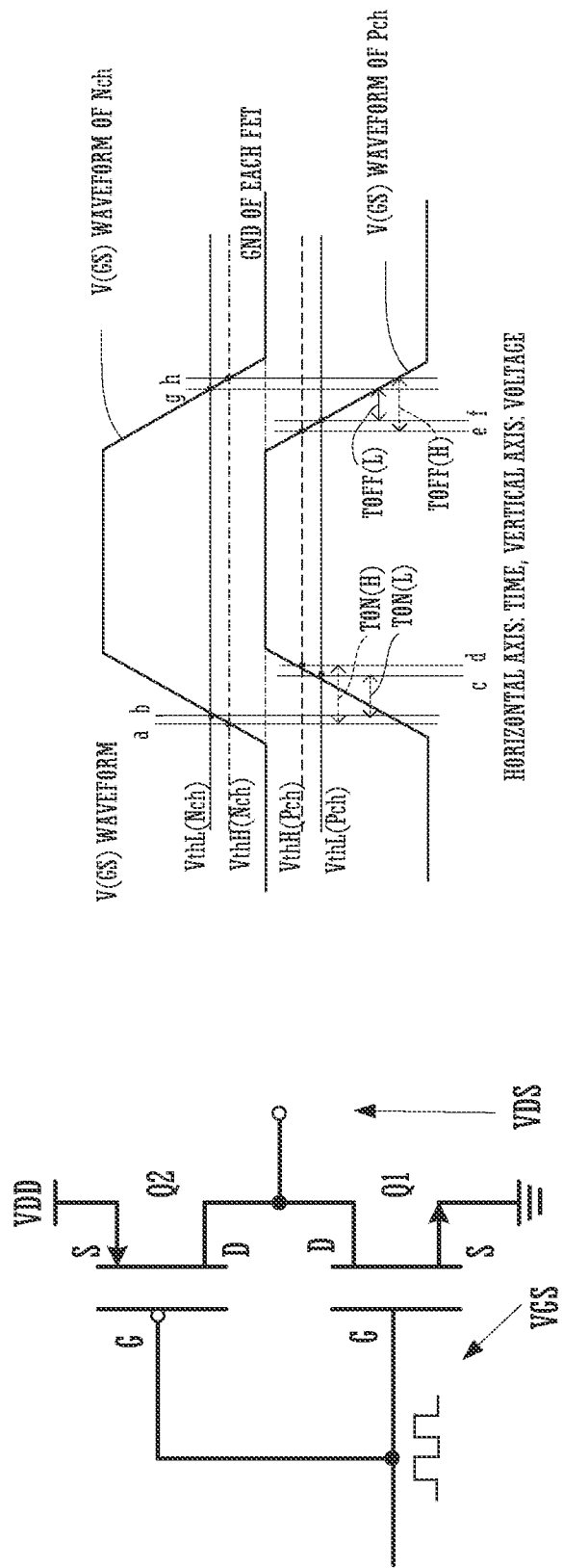
FIG. 8 shows a configuration of the gate drive circuit 2 when the temperature correction circuit 20 is not provided, and shows losses of the nMOSFET Q1 and a pMOSFET Q2.
Figure 9:
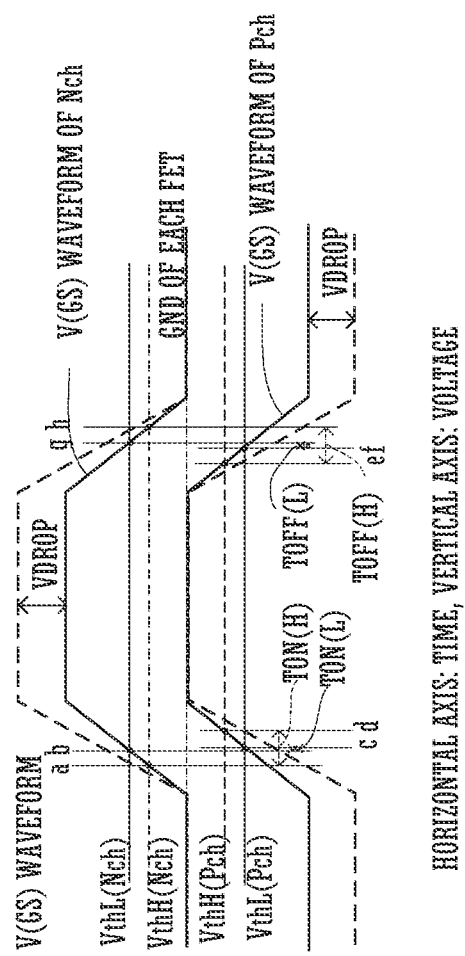
FIG. 9 shows a configuration of the gate drive circuit 2 when the temperature correction circuit 20 is provided, and shows losses of the nMOSFET Q1 and the pMOSFET Q2.
Figure 9:
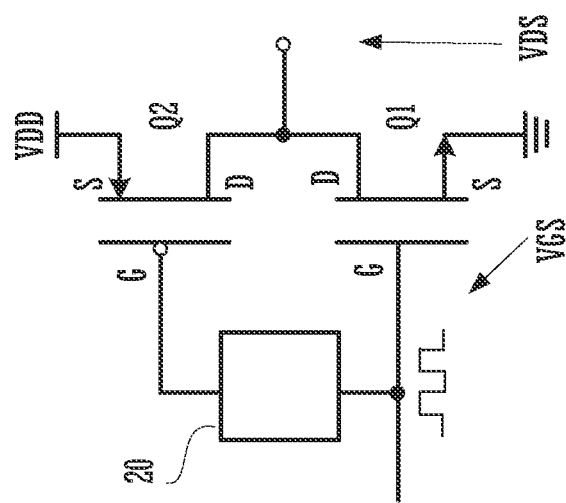

FIG. 8 shows a configuration of the gate drive circuit 2 when the temperature correction circuit 20 is not provided, and shows losses of the nMOSFET Q1 and the pMOSFET Q2. FIG. 9 shows a configuration of the gate drive circuit 2 when the temperature correction circuit 20 is provided, and shows losses of the nMOSFET Q1 and the pMOSFET Q2.

A pulse waveform (input pulse) shown on an upper side in FIG. 8 is the gate voltage V(GS) of the nMOSFET Q1. A pulse waveform (input pulse) shown on a lower side in FIG. 8 is the gate voltage V(GS) of the pMOSFET Q2.

In FIGS. 8 and 9, each of signs has the following meaning.
a threshold voltage of NchMOS (at high temperature)
b threshold voltage of NchMOS (at low temperature)
c threshold voltage of PchMOS (at low temperature)
d threshold voltage of PchMOS (at high temperature)
e threshold voltage of PchMOS (at high temperature)
f threshold voltage of PchMOS (at low temperature)
g threshold voltage of NchMOS (at low temperature)
h threshold voltage of NchMOS (at high temperature)

In FIG. 8, according to characteristics of the nMOSFET Q1 and the pMOSFET Q2, thresholds (voltage) (V(thL)) at the time when the nMOSFET Q1 and the pMOSFET Q2 are turned on at low temperature each differ from a corresponding one of thresholds (voltage) (V(thH)) at the time when the nMOSFET Q1 and the pMOSFET Q2 are turned on at high temperature (V(thL)>V(thH)). On the other hand, there are periods TON (H) and TON (L) during which both the nMOSFET Q1 and the pMOSFET Q2 are turned on simultaneously at the time when the nMOSFET Q1 is turned on (at the time when the pMOSFET Q2 is turned off). Further, there are periods TOFF (H) and TOFF (L) during which both the nMOSFET Q1 and the pMOSFET Q2 are turned on simultaneously at the time when the nMOSFET Q1 is turned off (at the time when the pMOSFET Q2 is turned on). During these periods TON (H) and TON (L), and periods TOFF (H) and TOFF (L), a short-circuit current flows into two MOSFETs, i.e., the nMOSFET Q1 and the pMOSFET Q2. At that time, a (heat) loss occurs. Especially, if high frequency switching is performed, this loss will be large.

Similarly to FIG. 8, a pulse waveform (input pulse) shown on an upper side in FIG. 9 is the gate voltage V(GS) of the nMOSFET Q1, and a pulse waveform shown on a lower side in FIG. 9 is the gate voltage V(GS) of the pMOSFET Q2. The pulse waveform shown on the upper side in FIG. 9 shows that the gate voltage V(GS) is lowered by only the drop voltage V(DROP) of the temperature correction circuit 20, when the nMOSFET Q1 is turned on. Further, the pulse waveform shown on the lower side of FIG. 9 shows that the gate voltage V(GS) is lowered by only the drop voltage V(DROP) of the temperature correction circuit 20, when the pMOSFET Q2 is on.

FIG. 9 shows that the periods TON (H) and TON (L) during which both the nMOSFET Q1 and the pMOSFET Q2 are turned on simultaneously at the time when the nMOSFET Q1 is turned on (at the time when the pMOSFET Q2 is turned off) are short as compared with those of FIG. 8. Further, FIG. 9 shows that the periods TOFF (H) and TOFF (L) during which both the nMOSFET Q1 and the pMOSFET Q2 are turned on simultaneously at the time when the nMOSFET Q1 is turned off (at the time when the pMOSFET Q2 is turned on) are also short as compared with those of FIG. 8.

In this way, the presence of the temperature correction circuit 20 makes it possible to reduce losses at turn-on time and turn-off time, which are caused by the temperature dependence of a threshold of MOSFET.

As mentioned above, according to the present exemplary embodiment, the presence of the temperature correction circuit 20 makes it possible to reduce a delay difference in each of turn-on delay time and turn-off delay time of an N-channel MOSFET and a P-channel MOSFET. Further, simultaneous ON time of the N-channel MOSFET and the P-channel MOSFET does not become long, so that an increase in losses can be prevented.

What is claimed is:

1. A gate drive circuit which drives an output element by amplifying an input pulse signal from a control board comprising:
    an N-channel MOSFET and a P-channel MOSFET which are connected in a push-pull to amplify the input pulse signal and whose connection point to each other is connected to the output element, and
    a temperature correction circuit which is connected to a gate of the P-channel MOSFET,
    wherein
    the N-channel MOSFET and the P-channel MOSFET have different thresholds (voltages) at turn-on at low temperatures (V(thL)) and at high temperatures (V(thH)), and
    the temperature correction circuit generates a voltage drop which varies as ambient temperature increases, receives the input pulse signal from the control board, and inputs the input pulse signal minus the voltage drop to the gate of the P-channel MOSFET.

2. The gate drive circuit according to claim 1, wherein the P-channel MOSFET has a higher turn-on threshold (voltage) at high temperature (V(thH(PcH))) than a turn-on threshold (voltage) at low temperature (V(thL (PcH))).

3. The gate drive circuit according to claim 1, wherein the temperature correction circuit generates the voltage drop which becomes larger as ambient temperature increases.

4. The gate drive circuit according to claim 3, wherein the temperature correction circuit includes a transistor, a collector terminal of the transistor being connected to the gate of the P-channel MOSFET and an emitter terminal of the transistor is connected to the control board, a resistor R1 connected between the collector terminal and the base of the transistor, a resistor R2 and R3 which are connected in series between a base terminal and the emitter terminal of the transistor, and a thermistor NTC connected in parallel to the resistor R3.

* * * * *